United States Patent
Hao

(10) Patent No.: US 11,136,504 B2
(45) Date of Patent: Oct. 5, 2021

(54) ETCHANT COMPOSITION

(71) Applicant: Wuhan China Star Optoelectronics Semiconductor Display Technology Co., Ltd., Wuhan (CN)

(72) Inventor: Qilin Hao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/492,131

(22) PCT Filed: Apr. 23, 2019

(86) PCT No.: PCT/CN2019/083773
§ 371 (c)(1),
(2) Date: Sep. 8, 2019

(87) PCT Pub. No.: WO2020/155424
PCT Pub. Date: Aug. 6, 2020

(65) Prior Publication Data
US 2020/0216759 A1    Jul. 9, 2020

(30) Foreign Application Priority Data

Jan. 31, 2019   (CN) .......................... 201910098520.3

(51) Int. Cl.
*C23F 1/16* (2006.01)
*C09K 13/08* (2006.01)
*C09K 13/04* (2006.01)

(52) U.S. Cl.
CPC .................................. *C09K 13/08* (2013.01)

(58) Field of Classification Search
CPC ............ C23F 1/16; C09K 13/08; C09K 13/04
See application file for complete search history.

(56) References Cited

U.S. PATENT DOCUMENTS 5,376,236 A * 12/1994 Hanson ..................... C23F 1/26
                                                                216/108
2018/0337253 A1* 11/2018 Bilodeau ........... H01L 21/32134

FOREIGN PATENT DOCUMENTS

| CN | 101130870 | 2/2008 |
| CN | 103668209 | 3/2014 |
| JP | 2004-156070 | 6/2004 |

OTHER PUBLICATIONS

"Perchloric acid, ACS, 48-50%, Alfa Aesar_Fisher Scientific", web site, no date.*
"PerchloricAcid_KansasStateUniversity", web site, no date.*
"Perchloric acid_chemical compound_Britannica", web site, no date.*

* cited by examiner

*Primary Examiner* — Thomas T Pham

(57) ABSTRACT

An etchant composition for wet etching a titanium-containing film. The etchant composition includes hydrofluoric acid as a primary oxidant, a co-oxidant that forms a dense oxide film on a surface of a titanium film during an etching process, an alkali metal salt that inhibits aggregation and adsorption of titanium ions during the etching process, and a solvent.

4 Claims, 1 Drawing Sheet

ETCHANT COMPOSITION

RELATED APPLICATIONS

This application is a National Phase of PCT Patent Application No. PCT/CN2019/083773 having International filing date of Apr. 23, 2019, which claims the benefit of priority of Chinese Patent Application No. 201910098520.3 filed on Jan. 31, 2019. The contents of the above applications are all incorporated by reference as if fully set forth herein in their entirety.

FIELD AND BACKGROUND OF THE INVENTION

The present application relates to the field of display panel technology, and in particular to an etchant composition for use in a display panel process.

An organic electroluminescent diode display device is widely used in the display field due to its self-luminous, simple structure, ultra-thin, fast response time, wide viewing angles, low power consumption, and the realization of a flexible display panel. As the demand for organic light emitting diodes (OLEDs) continues to increase, production cost of OLEDs is required to be further reduced. Currently, the production cost of OLEDs is influenced by equipment procurement and operating costs.

The requirement for the line width specification of an organic light emitting diode (OLED) is relatively strict. In addition, etching process of the OLED requires simultaneously etching a plurality kind of metal films. Currently, there are few etchant compositions in the market can meet the needs for simultaneously etching a plurality kind of metal films. Further, a metal titanium film and a titanium alloy film that are main etching targets are highly resistant to etch. The etching rate thereof in a wet etching is difficult to control, such that the application of wet etching is limited. Thus, at present, dry etching process is mainly used for simultaneous etching of a plurality kind of metal films. However, the cost of the dry etching process is high, resulting in the high production cost of OLED products. Therefore, there is a need for a new etchant composition that satisfies the requirement for the line width specification and the etching of multiple metal film layers, enabling replace dry etching with wet etching, such that reducing the cost of equipment procurement and operating costs.

SUMMARY OF THE INVENTION

The purpose of the present application is to provide an etchant composition for etching a multilayer metal film, such as titanium film/aluminum film/titanium film, by using a wet etching process instead of a dry etching process in a touch panel process to reduce equipment cost and production and cost, and improve production efficiency.

In order to achieve the object, according to an aspect of the present application, an etchant composition for wet etching a titanium-containing film is provided. The etchant composition includes hydrofluoric acid as a primary oxidant, a co-oxidant that forms a dense oxide film on a surface of a titanium film during an etching process, an alkali metal salt that inhibits aggregation and adsorption of titanium ions during the etching process, and a solvent.

In one embodiment, the etchant composition, based on total percentage by weight, includes hydrofluoric acid of 0.5-3%, the co-oxidant of 30-55%, the alkali metal salt of 1-5%, and remaining % of the solvent.

In a preferred embodiment, the etchant composition includes hydrofluoric acid of 2-3%, relative to the total weight of the etchant composition. For example, 2.1%, 2.2%, 2.3%, 2.4%, 2.5%, 2.6%, 2.7%, 2.8%, and 2.9%.

In a preferred embodiment, the etchant composition, based on total percentage by weight, includes an alkali metal salt of 1-3%, for example, 1.1%, 1.2%, 1.3%, 1.4%, 1.5%, 1.6%, 1.7%, 1.8%, 1.9%, 2.0%, 2.1%, 2.2%, 2.3%, 2.4%, 2.5%, 2.6%, 2.7%, 2.8%, and 2.9%.

In one embodiment, the co-oxidant is a mixture of at least two acids.

In one embodiment, the co-oxidant is a mixture of halogen acid and oxyacid.

In one embodiment, the halogen acid is one of perbromic acid and perchloric acid or a combination thereof.

In one embodiment, the oxyacid is nitric acid.

In one embodiment, the etchant composition, based on total percentage by weight, includes nitric acid of 1-5% by weight, and perchloric acid of 30-50% by weight.

In a preferred embodiment, the etchant composition, based on total percentage by weight, includes nitric acid of 2-3%. For example, 2.1%, 2.2%, 2.3%, 2.4%, 2.5%, 2.6%, 2.7%, 2.8%, and 2.9%.

In a preferred embodiment, the etchant composition, based on total percentage by weight, includes perchloric acid of 35-45%. For example, 36%, 37%, 38%, 39%, 40%, 41%, 42%, 43%, and 44%.

In one embodiment, the solvent is deionized water.

In one embodiment, the alkali metal salt is sodium nitrate.

In a preferred embodiment, an etchant composition is provided, relative to the total weight of the etchant composition, the etchant composition includes hydrofluoric acid of 0.5-3%, nitric acid of 0.5-5%, perchloric acid of 30-50%, sodium nitrate of 1-5%, and deionized water of remaining %.

In a preferred embodiment, relative to the total weight of the etchant composition, the etchant composition includes hydrofluoric acid of 2-3%, sodium nitrate of 1-3%, nitric acid of 2-3%, perchloric acid of 35-45%, and deionized water of remaining %.

According to another aspect of the present application, providing an application of the etchant composition in the wet etching of a titanium-containing film. For example, an application for etching a film containing titanium in a thin film transistor (TFT) array substrate. The titanium-containing film refers to a film including titanium in the composition and includes a single layer film or a multilayer film of a double layer film or more. The titanium-containing film may be, but not limited to, a single layer film of a titanium film or a titanium alloy film, or a multilayer film composed of a single layer film of a titanium film or a titanium alloy film and an aluminum film.

A titanium alloy film is mainly composed of a titanium film. The titanium alloy film may include Nd, Cu, Pd, Ni, and Mg, etc. and a nitride, an oxide, or a carbide thereof, but is not limited thereto.

In one embodiment of the present application, the titanium-containing film may be a multilayer film of an aluminum film/titanium film, a titanium film/aluminum film/titanium film, a titanium film/aluminum film, or an aluminum film/titanium film/aluminum film.

Beneficial Effect

In the present application, an etchant composition capable of simultaneously etching the titanium-containing multilayer film (such as multilayer film of aluminum film/titanium film, titanium film/aluminum film/titanium film, titanium film/aluminum film, or aluminum film/titanium film/aluminum film) is obtained by the rational selection of components and the synergy between the components.

The etchant composition described in the present application can be used for etching multilayer metal film of titanium film/aluminum film/titanium film. By using a wet etching process instead of a dry etching process in a touch panel process to reduce equipment cost and production cost and improve production efficiency.

BRIEF DESCRIPTION OF THE SEVERAL VIEWS OF THE DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the art based on these drawings without doing any creative activity.

DESCRIPTION OF SPECIFIC EMBODIMENTS OF THE INVENTION

Figure 1:
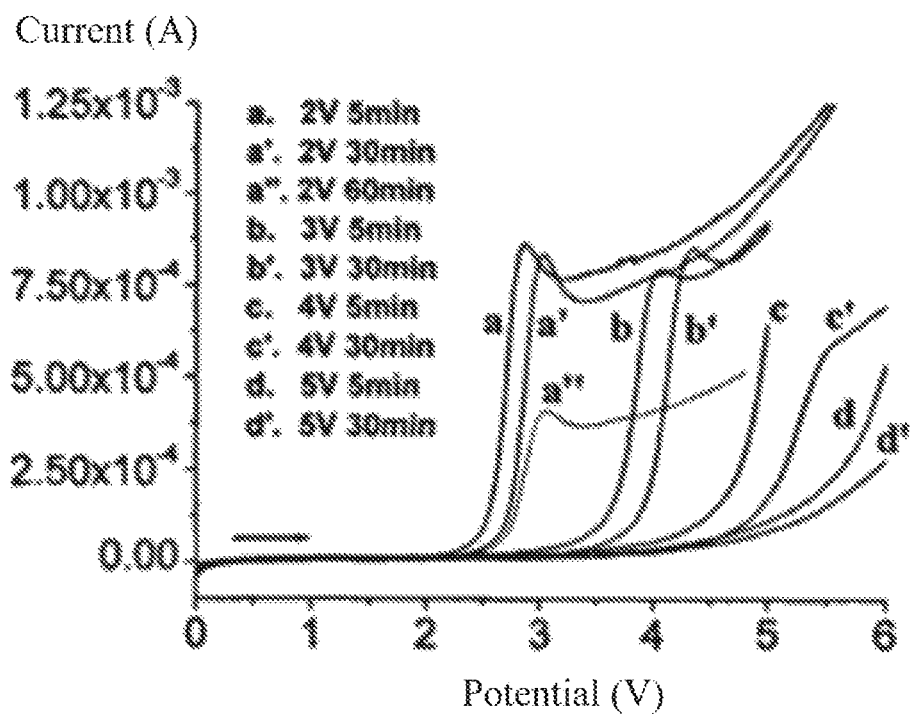
FIG. 1 is a polarization curve measured by a titanium electrode passivated at the various potential for various time, forming an oxide film in a 1.0 mol/L $HClO_4$ solution.

The embodiments of the present invention are described in detail below, and the examples of the embodiments are illustrated in the drawings, wherein the same or similar reference numerals indicate the same or similar elements or elements having the same or similar functions. The embodiments described below with reference to the drawings are exemplary, for the purpose of explaining the invention only and it is not to be construed as limiting the invention.

In the present invention, unless expressly stated and limited otherwise, "the first feature is above/below the second feature" may indicates that the first feature directly contacts the second feature, and may also indicates that the first feature indirectly contacts the second feature, for example, the first feature contacts the second feature by another feature between them. In addition, "the first feature above the second feature" may indicates that the first feature is directly above or obliquely above the second feature, or merely indicates that the level of the first feature is higher than the level of the second feature, and "the first feature below the second feature" may indicates that the first feature is directly below or obliquely below the second feature, or merely indicates that the level of the first feature is lower than the level of the second feature.

The following disclosure provides various embodiments or examples for implementing various structures of the present invention. In order to simplify the disclosure of the present invention, the components and arrangements of the specific examples are described below. They are merely examples and are not intended to limit the invention. Furthermore, the present invention may repeat reference numerals and/or reference letters in various examples. The repetition is for the purpose of simplification and clarity, and does not indicate the relationship between the various embodiments and/or arrangements discussed. Moreover, the present invention provides examples of various specific processes and materials, but one of ordinary skill in the art will recognize the use of other processes and/or the use of other materials.

In the present embodiment, an etchant composition for wet etching a titanium-containing film is provided. The etchant composition includes a primary oxidizing agent, a co-oxidizing agent, an alkali metal salt, and a solvent.

The primary oxidizing agent is hydrofluoric acid (HF), and when etching a single layer film or a multilayer film, it functions to oxidize the titanium film and perform wet etching. The hydrofluoric acid is in an amount of 0.5-3%, preferably 1-2%, based on the total weight of the etchant composition.

Experiments show that only hydrofluoric acid is dissociated during an etching process, and its hydrogen ions participate in the etching reaction so that a proportion of the hydrofluoric acid needs to be controlled in the process. When the hydrofluoric acid is too small, nitric acid will participate in the etching of the aluminum metal film. If the content of the hydrofluoric acid is less than 0.5%, the etching ability of the etchant composition is insufficient, which may result in a decrease in etching rate and a poor etching profile. Further, if the content of hydrofluoric acid exceeds 4%, an etching rate of the aluminum film in the titanium-containing film is decreased, and an etching rate of the titanium film or the titanium alloy film becomes too fast, resulting in an etching angle to be polygonal, and the subsequent non-metal film covering will collapse or has void.

The co-oxidizing agent is nitric acid and perchloric acid. The nitric acid is in an amount of 1-5%, preferably 2-3%, based on a total weight of the etchant composition. The perchloric acid is contained in an amount of 30-50%, preferably 35-45%.

The nitric acid ($HNO_3$) acts to oxidize a surface of the titanium film and the aluminum film during the etching process to form a dense oxide film, thereby decreasing the etching rate. It has been experimentally found that if the content of the nitric acid exceeds 5%, the oxide film formed by the titanium film/aluminum film is too dense, resulting in a decrease in the etching rate. The etching uniformity of the substrate is deteriorated, such that a problem of streaking may occur. If the content of the hydrofluoric acid is less than 1%, the undercutting problem of aluminum film may be caused because the etching rate is too fast.

Please refer to FIG. 1. FIG. 1 shows the polarization curves (scan with 50 mV/s) of a titanium electrode passivated at various potentials for various times in $HClO_4$ solution of 1.0 mol/L, and an oxide film is formed on the titanium electrode. FIG. 1 shows that the anodic oxygen evolution reaction causes the formation of oxides on a surface of the titanium film. With the oxygen evolution reaction and the formation of peroxide on the surface of the titanium film, a very thin insulating layer is formed on an outermost layer of the oxide surface to form a passivation layer. The oxide is stable and irreversible, which decreases the etching rate. Therefore, the perchloric acid ($HClO_4$) serves to form a dense oxide film on the surface of the titanium film during etching to retard an etching rate of the titanium film.

It has been experimentally found that in the case where the content of the perchloric acid is less than 30%, there is a problem of streaks due to uneven etching speed in the substrate. On the other hand, in the case where the content of the perchloric acid is more than 50%, a large number of bubbles are generated during the etching, and an oxide film on a surface of the titanium film becomes too dense to cause the etching rate decrease.

The alkali metal salt is sodium nitrate ($NaNO_3$). The sodium nitrate is in an amount of 1-5%, preferably 1-3%, based on a total weight of the etchant composition.

Figure 2:
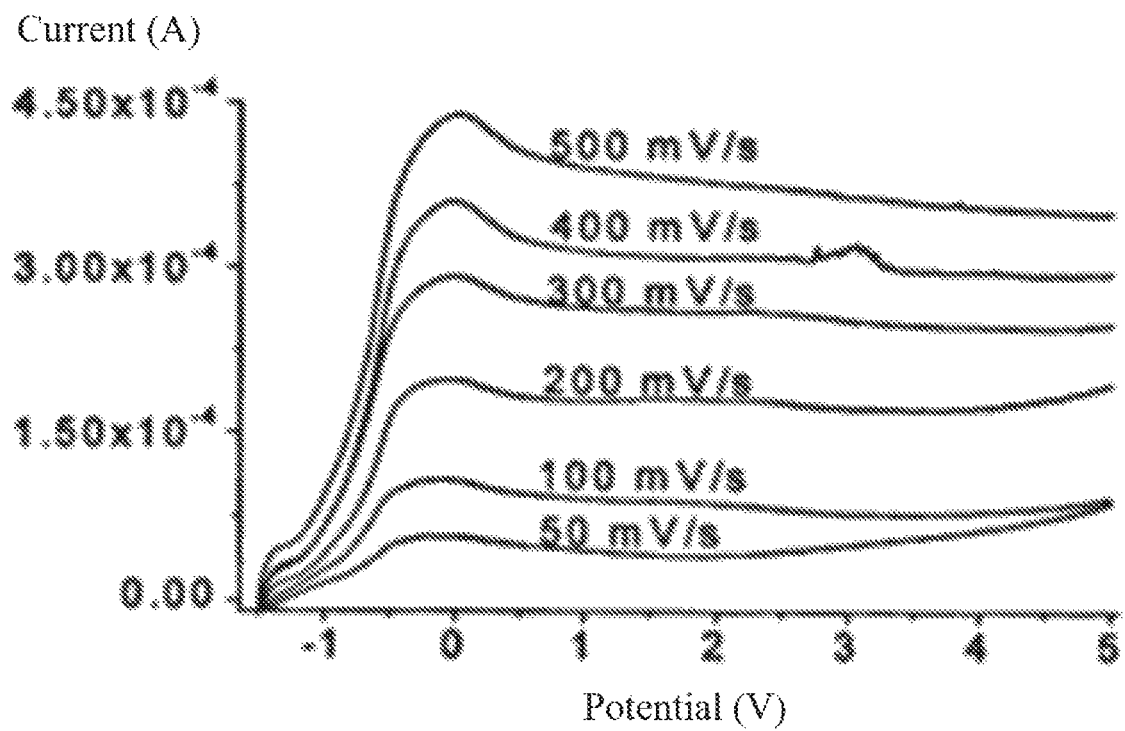
FIG. 2 is a polarization curve of a titanium electrode at various scan rates in a mixed solution of 0.1 mol/L NaF and 0.1 mol/L $NaClO_4$.

Please refer to FIG. 2. FIG. 2 is a superposition of polarization curves of titanium electrodes at various scan rates in a mixed solution of 0.1 mol/L NaF and 0.1 mol/L $NaClO_4$. As shown in FIG. 2, after adding sodium fluoride to the base solution of sodium perchlorate of 0.1 mol/L, the polarization current is significantly increased than that in the sodium perchlorate solution of 0.1 mol/L, indicating that the addition of fluoride ions does not change the passivation process of the titanium electrode surface. The fluoride ion reacts with the titanium film on a surface of the titanium electrode to form a complex $TiF_6^{2-}$, which accelerates the dissolution of the titanium film when fluoride ions are present. Therefore, the sodium nitrate acts to accelerate the reaction rate of the titanium film during an etching process, while inhibiting the aggregation and re-adsorption of titanium ions, and the etching rate is adjusted to achieve etching uniformity.

It has been experimentally found that in the case where a content of sodium nitrate is less than 1%, there is a problem that the etching uniformity in the substrate is decreased. In the case where a content of sodium nitrate is more than 5%, a reaction rate of the titanium film and the aluminum film is inconsistent due to an increase of the etching rate.

The solvent is water, preferably deionized water.

Thus, in this embodiment, an etchant composition is provided, relative to the total weight of the etchant composition, includes hydrofluoric acid of 0.5-3%, nitric acid of 0.5-5%, perchloric acid of 30-50%, sodium nitrate of 1-5%, and deionized water of remaining %. More preferably, relative to a total weight of the etchant composition, the etchant composition includes hydrofluoric acid of 2-3%, sodium nitrate of 1-3%, nitric acid of 2-3%, perchloric acid of 35-45%, and deionized water of remaining %.

The embodiment also provides an application of etchant composition in the wet etching of a titanium-containing film. For example, an application for etching a film containing titanium in a thin film transistor (TFT) array substrate. The titanium-containing film refers to a film including titanium in the composition and includes a single layer film or a multilayer film of a double layer film or more. The titanium-containing film may be, but not limited to, a single layer film of a titanium film or a titanium alloy film, or a multilayer film composed of a single film of a titanium film or a titanium alloy film and an aluminum film. A titanium alloy film is mainly composed of a titanium film, and the titanium alloy film may include Nd, Cu, Pd, Ni, and Mg etc., and a nitride, an oxide, or a carbide thereof, but is not limited thereto. The titanium-containing film may be a multilayer film of an aluminum film/titanium film, a titanium film/aluminum film/titanium film, a titanium film/aluminum film, or an aluminum film/titanium film/aluminum film.

Taking the touch panel production factory as an example, the equipment investment cost of the dry etching equipment is about 150 million yuan (RMB) under a condition of 45K capacity. With the wet etching using the etchant composition described in the present application, the equipment investment cost is only about 20 million yuan. In addition, the operating cost of the wet etching equipment is also slightly less than that of the dry etching equipment.

In the present application, an etchant composition capable of simultaneously etching a plurality of layers of the titanium-containing film (such as multilayer films of aluminum film/titanium film, titanium film/aluminum film/titanium film, titanium film/aluminum film, or aluminum film/titanium film/aluminum film) is obtained by rational selection of components and synergy between the components. Therefore, the etchant composition described in the present application can be used for etching multilayer metal film of titanium film/aluminum film/titanium film. By using a wet etching process instead of a dry etching process in a touch panel process to reduce equipment cost and production cost and improve production efficiency.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

INDUSTRIAL APPLICABILITY

The subject of the present application can be manufactured and used in the industry and has industrial applicability.

What is claimed is:

1. An etchant composition, based on total percentage by weight, comprising:
   hydrofluoric acid of 2-3% by weight,
   nitric acid of 2-3% by weight,
   perchloric acid of 35-45% by weight,
   sodium nitrate of 1-3% by weight, and
   a solvent of remaining % by weight, wherein the solvent is deionized water.

2. An etchant composition for etching a titanium-containing film, wherein the etchant composition comprises hydrofluoric acid as a primary oxidant, a co-oxidant that forms a dense oxide film on a surface of a titanium film during an etching process, an alkali metal salt that inhibits aggregation and adsorption of titanium ions during the etching process, and a solvent; wherein the etchant composition, based on total percentage by weight, comprises hydrofluoric acid of 0.5-3% by weight, nitric acid of 1-5% by weight, perchloric acid of 30-50% by weight, the alkali metal salt of 1-5% by weight, and remaining % by weight of the solvent; wherein the alkali metal salt is sodium nitrate, the co-oxidant is a mixture of nitric acid and perchloric acid, and the solvent is deionized water.

3. A use of the etchant composition according to claim 2 to etch a titanium-containing film.

4. The use according to claim 3, wherein the titanium-containing film is a single layer titanium film or a multilayer film comprising at least one titanium film.

* * * * *